United States Patent
Miki et al.

(10) Patent No.: US 7,655,491 B2
(45) Date of Patent: Feb. 2, 2010

(54) P-TYPE GROUP III NITRIDE SEMICONDUCTOR AND PRODUCTION METHOD THEREOF

(75) Inventors: Hisayuki Miki, Ichihara (JP); Hitoshi Takeda, Ichihara (JP)

(73) Assignee: Showa Denko K.K., Tokyo (JP)

( * ) Notice: Subject to any disclaimer, the term of this patent is extended or adjusted under 35 U.S.C. 154(b) by 444 days.

(21) Appl. No.: 10/585,999

(22) PCT Filed: May 11, 2005

(86) PCT No.: PCT/JP2005/009008

§ 371 (c)(1),
(2), (4) Date: Jul. 13, 2006

(87) PCT Pub. No.: WO2005/109478

PCT Pub. Date: Nov. 17, 2005

(65) Prior Publication Data

US 2008/0246053 A1    Oct. 9, 2008

Related U.S. Application Data

(60) Provisional application No. 60/572,269, filed on May 19, 2004.

(30) Foreign Application Priority Data

May 12, 2004    (JP)    ............................. 2004-142657

(51) Int. Cl.
*H01L 21/00*    (2006.01)
(52) U.S. Cl. ...................................................... 438/46
(58) Field of Classification Search ................. 438/540, 438/46
See application file for complete search history.

(56) References Cited

U.S. PATENT DOCUMENTS

| | | | | |
|---|---|---|---|---|
| 6,015,979 | A | * | 1/2000 | Sugiura et al. ................. 257/86 |
| 6,067,309 | A | | 5/2000 | Onomura et al. |
| 6,365,923 | B1 | | 4/2002 | Kamei |
| 2005/0042787 | A1 | | 2/2005 | Ito et al. |
| 2007/0090369 | A1 | * | 4/2007 | Kobayakawa ................. 257/77 |

FOREIGN PATENT DOCUMENTS

EP    1 179 859 A2    2/2002

(Continued)

*Primary Examiner*—Marcos D. Pizarro
*Assistant Examiner*—Eva Yan Montalvo
(74) *Attorney, Agent, or Firm*—Sughrue Mion, PLLC

(57) ABSTRACT

An object of the present invention is to provide a method for producing a p-type Group III nitride semiconductor which can be used to produce a light-emitting device exhibiting a low operation voltage and a sufficiently high reverse voltage.

The inventive method for producing a p-type Group III nitride semiconductor comprises, during lowering temperature after completion of growth of a Group III nitride semiconductor containing a p-type dopant,
immediately after completion of the growth, starting, at a temperature at which the growth has been completed, supply of a carrier gas composed of an inert gas and reduction of the flow rate of a nitrogen source; and
stopping supply of the nitrogen source at a time in the course of lowering the temperature.

4 Claims, 6 Drawing Sheets

FOREIGN PATENT DOCUMENTS

| | | | |
|---|---|---|---|
| JP | 09-199758 | * | 7/1997 |
| JP | 10-84160 A | | 3/1998 |
| JP | 2001-102623 A | | 4/2001 |
| JP | 2001-119064 A | | 4/2001 |
| JP | 2002-57161 A | | 2/2002 |
| JP | 2003-133649 A | | 5/2003 |
| JP | 2003-243302 A | | 8/2003 |
| JP | 2004-80047 A | | 3/2004 |
| JP | 2004-96021 A | | 3/2004 |
| WO | WO 03/068699 A1 | | 8/2003 |

* cited by examiner

P-TYPE GROUP III NITRIDE SEMICONDUCTOR AND PRODUCTION METHOD THEREOF

CROSS REFERENCE TO RELATED APPLICATION

This application is an application filed under 35 U.S.C. §111(a) claiming benefit, pursuant to 35 U.S.C. §119(e) (1), of the filing date of the Provisional Application No. 60/572,269 filed on May 19, 2004, pursuant to 35 U.S.C. §111(b).

TECHNICAL FIELD

The present invention relates to a method for producing a p-type Group III nitride semiconductor and to a Group III nitride semiconductor light-emitting device produced by the method. More particularly, the present invention relates to a method for producing a p-type Group III nitride semiconductor, the method being capable of producing a light-emitting device exhibiting a low forward voltage (Vf) and a sufficiently high reverse voltage (Vr) at a high yield.

BACKGROUND ART

In recent years, Group III nitride semiconductor materials have become of interest as materials for producing light-emitting devices which emit light of a short wavelength. Generally, a Group III nitride semiconductor material is grown on a substrate made of an oxide crystal such as a sapphire single crystal, or a Group III-V compound single crystal, through a method such as metal-organic chemical vapor deposition (MOCVD), molecular-beam epitaxy (MBE), or hydride vapor phase epitaxy (HVPE).

For a long time, a p-type Group III nitride semiconductor having a sufficient carrier concentration was difficult to produce. However, recent studies have revealed that a p-type Group III nitride semiconductor having a sufficient carrier concentration can be produced through, for example, irradiating an Mg-doped gallium nitride (GaN) with a low-energy electron beam (see Japanese Laid-Open Patent Application (kokai) No. 2-257679) or heating an Mg-doped gallium nitride in a hydrogen-free atmosphere (see Japanese Laid-Open Patent Application (kokai) No. 5-183189). One conceivable mechanism for yielding a p-type Group III nitride semiconductor having a sufficient carrier concentration is that a p-type dopant which is contained in the semiconductor and which has been passivated with hydrogen is activated through dehydrogenation on the basis of the aforementioned techniques. Actually, in Mg-doped gallium nitride semiconductor which was activated by an annealing, the concentration of hydrogen atoms is about 1/10 of the concentration of Mg atoms.

Generally, a Group III nitride semiconductor having high crystallinity is grown through metal-organic chemical vapor deposition (MOCVD). However, in a crystal growth apparatus employed in MOCVD, hydrogen molecules, hydrogen radicals, and atomic hydrogen, which are formed through decomposition of hydrogen gas (serving as a carrier gas for conveying source compounds to a substrate) or ammonia ($NH_3$) serving as a nitrogen source, are present at high concentrations. These hydrogen species are incorporated into a Group III nitride semiconductor crystal layer, during the growth thereof, and bond to a p-type dopant added to the crystal during cooling of the crystal layer from a growth temperature. The p-type dopant thus passivated with hydrogen is no longer active and does not provide holes. However, when the semiconductor sample is irradiated with an electron beam or heated, bonds between hydrogen and the p-type dopant are cleaved, thereby removing hydrogen from the crystal, whereby the p-type dopant can be activated.

Of the above two approaches, irradiation with an electron beam can be applied to only a limited area for one operation, and treating the entire area of the semiconductor requires a long time. Thus, this approach is not commonly employed in the industry.

When a p-type Group III nitride semiconductor produced through the other approach; i.e., heat treatment is used to fabricate light-emitting device wafers, some (a certain percentage of) chips have been found to exhibit a low voltage (Vr), which is a voltage generated upon passing a predetermined current in a reverse direction with respect to the pn junction and which is one of the electric characteristics determined after providing electrodes for the chips. Such low Vr values indicate leakage of current with respect to the pn junction, which is not desired for device products. When such failure chips are removed, productivity drops considerably. In general, when hydrogen is removed from a Group III nitride semiconductor through heat treatment, nitrogen is known to be removed simultaneously, thereby reducing crystallinity. This phenomenon may be a cause of lowering Vr.

Meanwhile, a technique for reducing the resistance of a semiconductor layer doped with a p-type impurity element has been disclosed (see Japanese Laid-Open Patent Application (kokai) No. 8-115880). In the technique, during the course of cooling a gallium-nitride-based compound semiconductor doped with a p-type impurity element, an atmosphere containing ammonia gas is changed to a hydrogen or nitrogen atmosphere at 400° C. or higher. The document discloses an example in which an Mg-doped layer whose growth has been completed is cooled to 600° C. under $NH_3$—$H_2$ mixture and, at 600° C., the supply of $NH_3$ is stopped and the atmosphere becomes only hydrogen.

The experiments conducted previously by the present inventors revealed that device operation voltage cannot be reduced when cooling to 600° C. is performed under an $NH_3$ flow. Particularly, when a positive electrode is formed from a metallic material (e.g., Pt), the operation voltage before bonding, which has been sufficiently lowered, is elevated through the heating, at about 300° C., carried out during bonding.

It has also been reported that a sufficient carrier concentration is attained by cooling a Group III nitride semiconductor from a growth temperature to room temperature in an atmosphere of inert gas instead of $H_2$ gas or $NH_3$ gas (see Japanese Laid-Open Patent Application (kokai) No. 8-125222). In an example disclosed in the document, a p-type semiconductor is produced by substituting the growth atmosphere by nitrogen gas or inert gas via vacuum as a transition state.

However, even when a grown semiconductor was cooled in an atmosphere of inert gas instead of $H_2$ gas or $NH_3$ gas, semiconductor chips exhibiting low device operation voltage cannot be produced unconditionally at high yield. In other words, semiconductor chips exhibiting excellent characteristics cannot be produced at high yield and high reproducibility, even when the conditions as stipulated in the document are controlled. In addition, when a positive electrode material such as Pt is employed, the operation voltage increases due to the heat applied during bonding.

There has been disclosed another technique including, immediately after completion of a growth of a nitride semiconductor, changing the growth atmosphere to an inert gas atmosphere at 1,100° C. (i.e., growth temperature) (see Japanese Laid-Open Patent Application (kokai) No. 9-129929).

This technique requires 2 to 3 hours for lowering the temperature to room temperature from the time of changing the atmosphere to inert gas.

The present inventors previously confirmed, through experiments, that Vr of the produced chips was lowered according to the above technique in which the atmosphere was changed to inert gas immediately after growth, and that lowering temperature over a long period of time lowered Vr.

Finally, there has been disclosed a technique, for growing a low-resistance p-type gallium-nitride-based semiconductor, including cooling (to ≦700° C.) a semiconductor crystal grown at a 700° C. or higher, in an atmosphere of a carrier gas other than hydrogen (see Japanese Laid-Open Patent Application (kokai) No. 9-199758). In an example described in the document, a p-type gallium-nitride-based semiconductor grown at 1,030° C. is cooled in an atmosphere composed of hydrogen and ammonia, and the atmosphere is changed to nitrogen at 700° C.

The present inventors examined the above growth technique. Even when a grown semiconductor was cooled (to ≦700° C.) in a gas atmosphere other than hydrogen, semiconductor chips exhibiting low device operation voltage could not be produced at high yield. In other words, semiconductor chips exhibiting excellent characteristics cannot be produced at high yield and high reproducibility, even when the conditions as stipulated in the document are controlled. In addition, when a positive electrode material such as Pt is employed, the operation voltage increases due to the heat applied during bonding.

As described above, according to the methods disclosed in Japanese Laid-Open Patent Applications (kokai) No. 5-183189 and No. 9-129929, chips exhibiting leakage are produced, due to a low Vr. According to the methods disclosed in Japanese Laid-Open Patent Applications (kokai) No. 8-115880, No. 8-125222, and No. 9-199758, an operation voltage increases. Particularly when a positive electrode material such as Pt is employed, the operation voltage increases due to the heat applied during bonding.

Thus, hitherto, there has never been proposed a problem-free method for forming a semiconductor layer containing a p-type dopant for fabrication of a Group III nitride semiconductor device, which method attains both satisfactory device characteristics and satisfactory yield.

The aforementioned documents disclose the requirement for reducing the resistance of a layer containing a p-type dopant, and a low-resistive p-type semiconductor layer is provided through any of the disclosed techniques.

DISCLOSURE OF INVENTION

The present invention has been conceived with the aim of solving the problems involved in the aforementioned conventional techniques. Thus, an object of the present invention is to provide a method for producing a p-type Group III nitride semiconductor which can be used to produce a light-emitting device exhibiting a low operation voltage and a sufficiently high reverse voltage.

The present invention provides the following.

(1) A method for producing a p-type Group III nitride semiconductor, wherein the method comprises, during lowering temperature after completion of growth of a Group III nitride semiconductor containing a p-type dopant, immediately after completion of the growth, starting, at a temperature at which the growth has been completed, supply of a carrier gas composed of an inert gas and reduction of the flow rate of a nitrogen source; and stopping supply of the nitrogen source at a time in the course of lowering temperature.

(2) A production method according to (1) above, wherein the temperature when the growth has been completed is 900° C. or higher.

(3) A production method according to (1) or (2) above, wherein the nitrogen source is ammonia gas.

(4) A production method according to any one of (1) to (3) above, wherein the carrier gas employed during growth of the semiconductor contains hydrogen gas.

(5) A production method according to any one of (1) to (4) above, wherein the flow rate of the nitrogen source after the reduction is 0.001 to 10% with respect to the flow rate of the total volume of gas.

(6) A production method according to any one of (1) to (5) above, wherein supply of nitrogen source is stopped at 700 to 950° C.

(7) A p-type Group III nitride semiconductor containing hydrogen atom in an amount which is more than ⅓ the p-type dopant concentration and which is less than the p-type dopant concentration.

(8) A p-type Group III nitride semiconductor having a resistivity of 20 Ω·cm to 10,000 Ω·cm.

(9) A Group III nitride semiconductor light-emitting device comprising a substrate; an n-type layer, a light-emitting layer, and a p-type layer, the layers being provided atop the substrate and being formed of a Group III nitride semiconductor; a negative electrode provided on the n-type layer; and a positive electrode provided on the p-type layer, wherein the p-type layer is produced through a production method according to any one of (1) to (6) above.

(10) A Group III nitride semiconductor light-emitting device comprising a substrate; an n-type layer, a light-emitting layer, and a p-type layer, the layers being provided atop the substrate and being formed of a Group III nitride semiconductor; a negative electrode provided on the n-type layer; and a positive electrode provided on the p-type layer, wherein the p-type layer is composed of a p-type Group III nitride semiconductor according to (7) or (8) above.

(11) A light-emitting device according to (9) or (10) above, wherein the positive electrode is formed of a platinum group metal selected from among Pd, Pt, Rh, Os, Ir, and Ru.

(12) A light-emitting device according to any one of (9) to (11) above, which is of a flip-chip type.

(13) A light-emitting device according to any one of (9) to (11) above, which is of a face-up type.

According to the present invention, a p-type Group III nitride semiconductor exhibiting satisfactory characteristics for use in semiconductor devices can be produced. Thus, a Group III nitride semiconductor light-emitting device exhibiting no increase in operation voltage caused by heat and high Vr can be effectively produced from the p-type Group III nitride semiconductor.

BEST MODES FOR CARRYING OUT THE INVENTION

Figure 1:
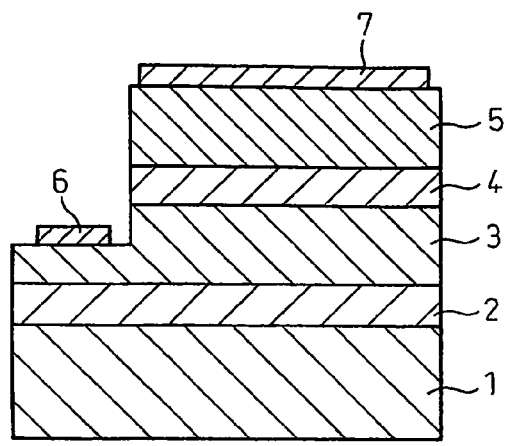
FIG. 1 is a schematic illustration of a Group III nitride semiconductor light-emitting device of the present invention.

Examples of the Group III nitride semiconductor to which the method of the present invention for producing a p-type semiconductor can be applied include 2-component mixed crystals such as GaN, InN and AlN; 3-component mixed crystals such as InGaN and AlGaN; and 4-component mixed crystals such as InAlGaN. In the present invention, examples of the Group III nitride semiconductor further include 3-component mixed crystals containing a non-nitrogen Group V element such as GaPN and GaNAs; 4-component mixed crystals further containing In or Al such as InGaPN, InGaAsN, AlGaPN, and AlGaAsN; 5-component mixed crystals further containing In and Al such as AlInGaPN and AlInGaAsN; 5-component mixed crystals further containing P and As such as AlGaPAsN and InGaPAsN; and 6-component mixed crystals containing all the elements such as AlInGaPAsN.

Particularly, the method of the present invention is preferably applied to produce, among the above semiconductors, Group III nitride semiconductors containing sole N as a Group V element such as 2-component mixed crystals such as GaN, InN, and AlN; 3-component mixed crystals such as InGaN and AlGaN; and 4-component mixed crystals such as InAlGaN, which can be readily produced and are resistive to decomposition. When these semiconductors are represented by formula $Al_xIn_yGa_{1-x-y}N$ ($0 \leq X+Y \leq 1$), X is preferably 0 to 0.5, and Y is preferably 0 to 0.1.

Examples of the p-type dopant which can be employed in the present invention include Mg, Ca, Zn, Cd, and Hg, which are reported or considered to impart p-type conductivity to Group III nitride semiconductors. Among these dopants, Mg is particularly preferred as a p-type dopant, because Mg exhibits high doping activity when heat treatment is performed. The amount of dopant is preferably $1 \times 10^{18}$ to $1 \times 10^{21}$ $cm^{-3}$. When the amount is less than $1 \times 10^{18}$ $cm^{-3}$, emission intensity decreases, whereas when the amount is more than $1 \times 10^{21}$ $cm^{-3}$, crystallinity is impaired. Both cases are not preferred. More preferably, the amount of dopant is $1 \times 10^{19}$ to $1 \times 10^{20}$ $cm^{-3}$.

The p-type semiconductor layer fabricated through the method of the present invention may contain hydrogen atoms in the crystal. In some cases, hydrogen atoms contained in the semiconductor crystal are preferable for fabricating devices exhibiting high reverse voltage (Vr). The amount of hydrogen atoms contained in the crystal is preferably smaller than the amount of p-type dopant. This is because, when the hydrogen atom amount is equal to or higher than the p-type dopant amount, electric contact of the p-type electrode becomes difficult to attain. The hydrogen atom amount is more preferably 9/10 or less the p-type dopant amount, particularly preferably 7/8 or less the p-type dopant amount. However, when the hydrogen atom amount is 1/5 or less the p-type dopant amount, release of nitrogen also occurs. Thus, the hydrogen atom amount is preferably more than 1/5, more preferably 1/3 or more, still more preferably 1/2 or more. The Mg atom concentration and the hydrogen atom concentration of a p-type semiconductor layer are quantified through conventional SIMS (Secondary Ion Mass Spectroscopy).

Presence of hydrogen in the crystal does not reduce electrical resistance of the p-type layer. However, such a high resistance is not detrimental to device characteristics. In semiconductor devices including a Group III nitride semiconductor, the formed p-type layer is usually thinner as compared to other semiconductor layer. Therefore, resistance of the p-type layer per se does not greatly affect device operation voltage (Vf). High resistivity of the p-type layer is rather preferable for maintaining Vr high.

The p-type layer preferably has a resistivity about 20 Ω·cm to about 10,000 Ω·cm. When the resistivity is higher than 10,000 Ω·cm, emission intensity may decrease, whereas when the resisitivity is lower than 20 Ω·cm, Vr may decrease. More preferably, the resisitivity is 50 Ω·cm to 2,000 Ω·cm, with 100 Ω·cm to 1,000 Ω·cm being further more preferred. Resistivity is determined through conventional TLM (Transfer Length Measurement).

No particular limitation is imposed on the method for growing the p-type Group III nitride semiconductor to which the present invention is applied, and there may be employed any known method for growing a Group III nitride semiconductor, such as MOCVD (metal-organic chemical vapor deposition), HVPE (hydride vapor phase epitaxy), or MBE (molecular beam epitaxy). From the viewpoints of layer thickness controllability and mass productivity, MOCVD is preferably employed.

In the case of MOCVD, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al source, trimethylindium (TMI) or triethylindium (TEI) is employed as an In source, and ammonia ($NH_3$), hydrazine ($N_2H_4$), or the like is employed as a nitrogen source. Bis(cyclopentadienyl)magnesium ($Cp_2Mg$) or bis(ethylcyclopentadienyl)magnesium (($EtCp)_2Mg$) serving as an Mg source or dimethylzinc ($Zn(CH_3)_2$) serving as a Zn source is employed as a p-type dopant.

When the carrier gas contains hydrogen and/or the nitrogen source is composed of $NH_3$, the effects of the present invention can fully be attained.

The growth temperature is preferably 900° C. or higher so as to attain excellent crystallinity and contact resistance, more preferably 1,000° C. to 1,250° C.

Next, the procedure of cooling a semiconductor stacked structure to room temperature after completion of growth of a Group III nitride semiconductor containing a p-type dopant and removing it from a growth apparatus will be described. When the carrier gas during growth contains hydrogen, the carrier gas must be altered to a hydrogen-free inert gas at the growth temperature immediately after completion of the growth. The acceptable time lag required for changing the carrier gas is shorter than about one minute. If hydrogen gas flow is continued for one minute or longer, a sufficiently low operation voltage cannot be attained. The inert gas replacing hydrogen is preferably nitrogen. Alternatively, argon, helium, or a mixture thereof may also be employed.

Simultaneously when the carrier gas is changed, the flow rate of the nitrogen source is reduced, which is a key issue. The flow rate of the nitrogen source during growth is generally 20% to 70% with respect to the flow rate of the total volume of gas. After reduction of the flow rate, the flow rate is preferably 10% or less with respect to the flow rate of the total volume of gas, more preferably 1% or less. When the amount of the nitrogen source is excessively high, device operation voltage cannot be lowered as intended. However, if the flow of the nitrogen source is stopped (i.e., controlled to 0), nitrogen is released from the p-type layer crystal, thereby lowering Vr of produced devices. The flow rate of the nitrogen source is preferably controlled to 0.001% or higher with respect to the flow rate of the total volume of gas, more preferably 0.01% or higher.

Lowering of the temperature is preferably started immediately after changing of the flow rate of the nitrogen source and changing of the carrier gas. When the retention period at the growth temperature after completion of growth is long, crystallinity is impaired, and heat-induced damage is accumulated in the light-emitting layer, leading to decrease in emission intensity.

In addition, the reduced flow rate of the nitrogen source is required to be adjusted to 0 in the course of temperature lowering. When devices are fabricated through a cooling step (for example to 300° C.) without stopping flow of the nitrogen source, an operation voltage of the devices is increased by the heat applied during bonding.

Controlling of the nitrogen source flow to 0 in the course of lowering temperature is preferably performed at 700° C. to 950° C. When the control of the nitrogen source flow to 0 is performed at a temperature higher than 950° C., Vr of the devices is lowered, whereas when the nitrogen source is continued to flow to a temperature lower than 700° C., an operation voltage increases due to heat.

The time from the completion of growth to control the nitrogen flow rate to 0, which depends on the temperature lowering rate, is about 30 seconds to about eight minutes.

The p-type Group III nitride semiconductor of the present invention and the production method of the invention can be applied to production of any of a variety of semiconductor devices, so long as the devices require a p-type Group III nitride semiconductor. Examples of the semiconductor devices include light-emitting devices such as light-emitting diodes and laser diodes; high-speed transistors; and photo detectors. Among these semiconductor devices, the present invention is particularly preferably applied to production of semiconductor light-emitting devices which require formation of a pn junction and a positive electrode exhibiting excellent characteristics.

FIG. 1 is a schematic illustration of a p-type Group III nitride semiconductor light-emitting device produced from the p-type Group III nitride semiconductor of the invention and through the production method of the invention. In FIG. 1, an n-type semiconductor layer 3, light-emitting layer 4, and p-type semiconductor layer 5, which are composed of a group III nitride semiconductor, are layered in this order on the substrate 1 via a buffer layer 2 as needed. A negative electrode 6 and a positive electrode 7 are provided on the n-type semiconductor layer 3 and the p-type semiconductor layer 5, respectively.

No particular limitation is imposed on the material of the substrate 1, and any known substrate, such as sapphire, SiC, GaN, AlN, Si, ZnO, and other oxides, may be employed. Of these, sapphire is preferred. The buffer layer 2 is provided, in accordance with needs, so as to adjust lattice-mismatch between the substrate and the n-type semiconductor layer 3 grown thereon. The buffer layer is formed through a conventionally known technique in accordance with needs.

The n-type semiconductor layer 3 may be formed so as to have a desired structure and composition through a technique well known in the art. Generally, the n-type semiconductor layer is composed of a contact layer and a cladding layer, the contact layer attaining excellent Ohmic contact with the negative electrode 6 and the cladding layer having a bandgap wider than that of the light-emitting layer. The negative electrode may be formed so as to have a desired structure and composition through a technique well known in the art.

No particular limitation is imposed on the composition and structure of the light-emitting layer 4, and any known structure, such as a single quantum well (SQW) structure and a multiple quantum well (MQW) structure, may be employed.

The p-type semiconductor layer 5 is formed through the production method of the present invention. The composition and structure of the semiconductor layer may be controlled as desired through a technique well known in the art. Similar to the n-type semiconductor layer, the p-type semiconductor layer is composed of a contact layer and a cladding layer, the contact layer attaining excellent Ohmic contact with the positive negative electrode and the cladding layer having a bandgap wider than that of the light-emitting layer.

The positive electrode 7 which is to be in contact with the p-type layer produced through the method of the invention may be formed from a metal such as Au, Ni, Co, Cu, Pd, Pt, Rh, Os, Ir, or Ru. The positive electrode may contain a transparent oxide such as ITO, NiO, or CoO. The transparent oxide may be incorporated into the metal film in the form of aggregates. Alternatively, the transparent oxide film may be laminated on the metal film.

Particularly when the positive electrode is formed from a platinum-group metal such as Pd, Pt, Rh, Os, Ir, or Ru, the semiconductor light-emitting device fully attains the effects of the present invention; i.e., is prevented from an elevation of an operation voltage caused by heat during bonding. Among these metal elements, Pd, Pt, and Rh are useful as high purity materials are comparatively readily available.

The positive electrode may be formed on virtually the entire surface or formed in the lattice-like or dendritic form. After formation of the positive electrode, thermal annealing may be performed so as to alloy or make the electrode to be transparent. This annealing is optional.

The semiconductor device may be a face-up (FU) type in which light is emitted from the semiconductor side through a transparent positive electrode. Alternatively, a flip-chip (FC) type in which light is emitted from the substrate side through employment of a reflecting-type positive electrode may also be employed.

EXAMPLES

The present invention will next be described in detail by way of examples, which should not be construed as limiting the invention thereto.

Example 1

Figure 2:
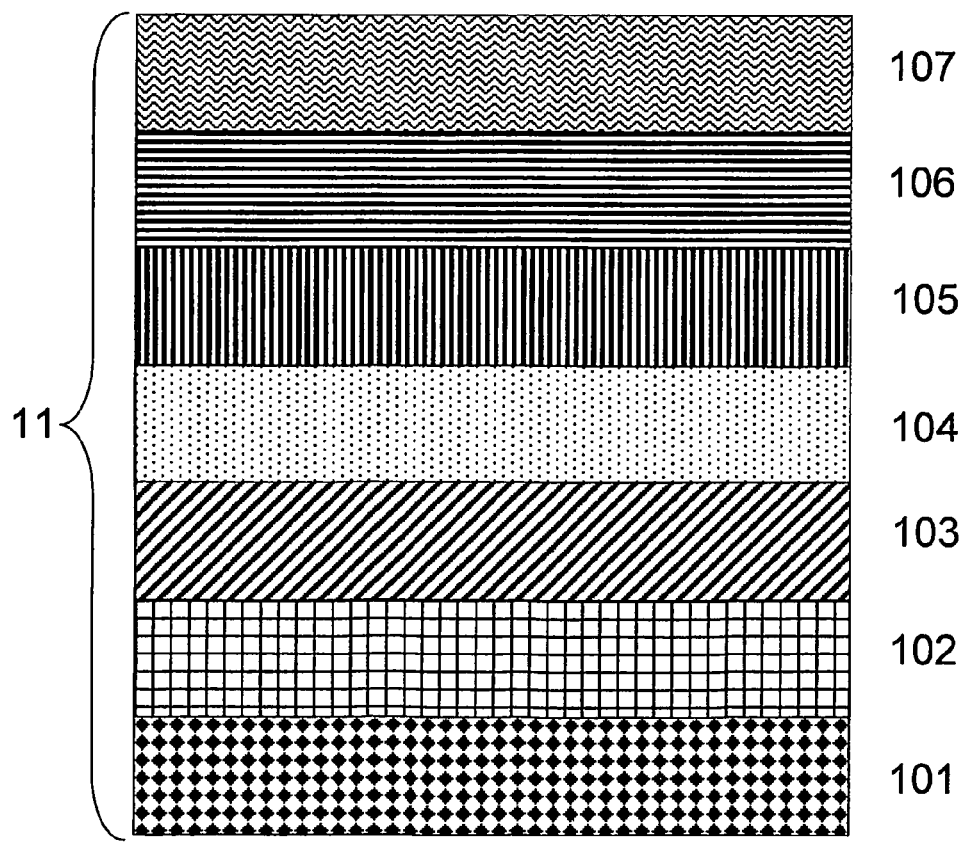
FIG. 2 is a schematic cross-sectional view showing the stacked structure fabricated in Example 1.
Figure 3:
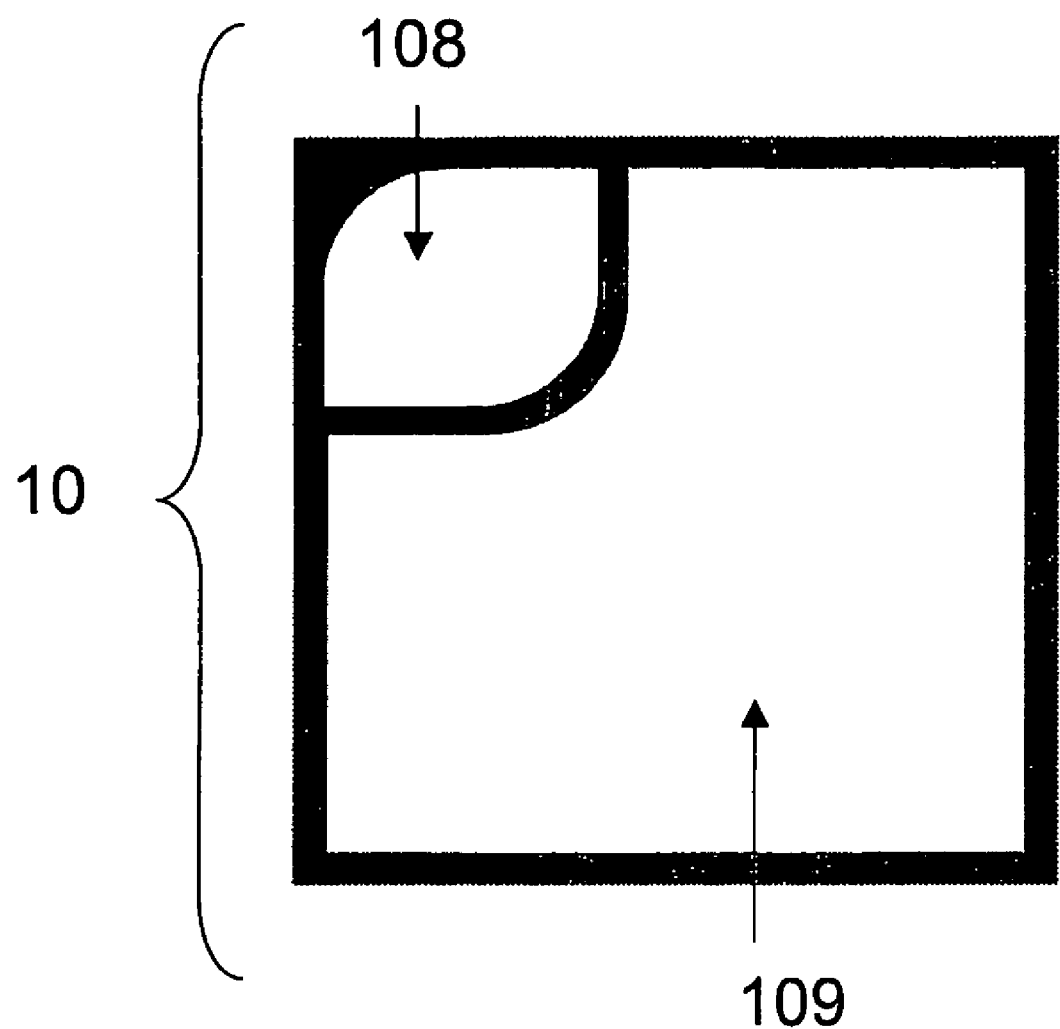
FIG. 3 is a schematic plan view of the LED fabricated in Example 1.

FIG. 2 is a schematic cross-sectional view showing a stacked structure 11 employed for producing an LED 10 described in Example 1. FIG. 3 is a schematic plan view of the LED 10.

The stacked structure 11 included a substrate 101 formed of sapphire having a c-plane ((0001) crystal plane). On the substrate, via an AlN buffer layer (not illustrated), the following layers were sequentially formed: an undoped GaN layer (thickness: 8 µm) 102; a silicon (Si)-doped n-type GaN layer (thickness: 2 µm, carrier concentration: $1\times10^{19}$ cm$^{-3}$) 103; an Si-doped n-type $Al_{0.07}Ga_{0.93}N$ cladding layer (thickness: 25 nm, carrier concentration: $1\times10^{18}$ cm$^{-3}$) 104; a light-emitting layer 105 of a multiple quantum well structure including Si-doped GaN barrier layers (6 layers, thickness: 14.0 nm, carrier concentration: $1\times10^{18}$ cm$^{-3}$) and undoped $In_{0.20}Ga_{0.80}N$ well layers (5 layers, thickness: 2.5 nm); an Mg-doped p-type $Al_{0.07}Ga_{0.93}N$ cladding layer 106 (thickness: 10 nm); and an Mg-doped p-type $Al_{0.02}Ga_{0.98}N$ contact layer 107 (thickness: 150 nm). These layers 102 to 107 of the stacked structure 11 were grown through a conventional reduced-pressure MOCVD means.

Among them, the Mg-doped p-type AlGaN contact layer 107 was grown through the following procedure.

(1) After completion of the growth of the Mg-doped p-type $Al_{0.07}Ga_{0.09}N$ cladding layer 106, the pressure inside the growth reactor furnace was adjusted to $2 \times 10^4$ Pa. Hydrogen was employed as a carrier gas.

(2) Growth of an Mg-doped p-type AlGaN layer from trimethylgallium, trimethylaluminum, and ammonia serving as sources and biscyclopentamagnesium serving as an Mg-dopant was started at 1,020° C.

(3) Trimethylgallium, trimethylaluminum, ammonia, and biscyclopentamagnesium were continuously supplied to a growth reaction furnace for four minutes, whereby an Mg-doped p-type $Al_{0.02}Ga_{0.98}N$ layer having a thickness of 0.15 µm was formed.

(4) Supply of trimethylgallium, trimethylaluminum, and biscyclopentamagnesium to the growth reactor furnace was stopped, to thereby terminate the growth of the Mg-doped p-type $Al_{0.02}Ga_{0.98}N$ layer.

Immediately after completion of vapor-phase growth of the Mg-doped p-type AlGaN layer serving as the contact layer 107, the carrier gas was changed from hydrogen to nitrogen, and the flow rate of ammonia was reduced. The amount of reduced gas was compensated for with nitrogen serving as a carrier gas. Specifically, a flow rate of ammonia during growth of 50% with respect to the flow rate of the total volume of gas was reduced to 0.2%, and simultaneously operation of a high-frequency induction heater that had been employed for heating the substrate 101 was stopped.

Figure 4:
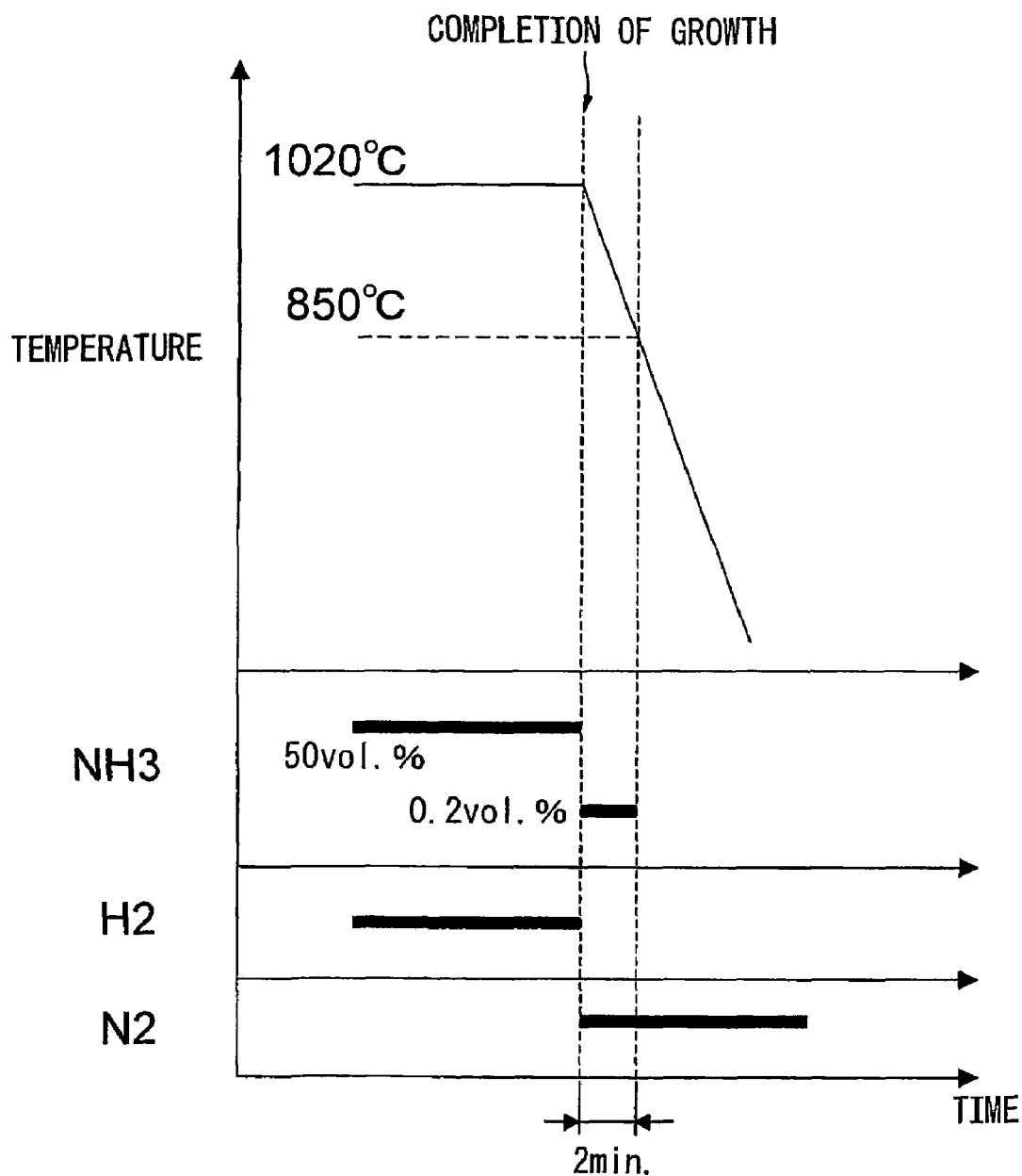
FIG. 4 is a chart schematically showing a temperature lowering profile employed in Example 1.

Under these conditions, the stacked structure was maintained for two minutes, and then flow of ammonia was stopped. The substrate temperature at the instance was 850° C. FIG. 4 is a chart schematically showing a temperature lowering profile.

After cooling to room temperature, the stacked structure 11 was removed from the growth reactor furnace, and the magnesium atom concentration and the hydrogen atom concentration of the contact layer 107 were quantitatively determined through conventional SIMS. The Mg atom concentration was found to be $7 \times 10^{19}$ cm$^{-3}$, and the concentration was virtually uniform from the top to the bottom in the depth direction. The hydrogen atom concentration was found to be $6 \times 10^{19}$ cm$^{-3}$ and almost uniformly distributed. The resistivity of the contact layer 107 was estimated to be about 150 Ω·cm through conventional TLM.

The LED 10 was fabricated from the stacked structure 11 having the aforementioned p-type contact layer. Firstly, the region of the structure where a negative electrode 108 was to be formed was dry-etched in a typical manner, whereby the above region of the Si-doped GaN layer 103 was exclusively exposed. On the exposed surface, the negative electrode 108 (titanium (Ti)/aluminum (Al)) was formed.

On virtually the entire remaining surface of the contact layer 107, a positive electrode 109 was formed. The positive electrode had a multilayer structure of platinum (Pt) film/rhodium (Rh) film/gold (Au) film and a function of reflecting light emitted from the light-emitting layer to the sapphire substrate 101. The Pt film was in contact with the surface of the p-type contact layer 107.

After formation of the negative electrode 108 and the positive electrode 109, the back of the sapphire substrate 101 was polished by use of abrasive grains such as diamond particles, to thereby form a mirror-finished surface. Then, the stacked structure 11 was cut into square (350 µm×350 µm) LED 10 pieces. Each piece was sub-mounted via the negative electrode and the positive electrode, thereby forming a flip type chip. The chip was placed on a lead frame and wire-bonded to the lead frame with gold (Au) wire.

Electric characteristics and emission characteristics of the flip-chip type LEDs were evaluated when forward current was caused to flow between the negative electrode 108 and the positive electrode 109. The forward voltage (Vf) at a forward current of 20 mA was found to be 3.2 V. The reverse voltage (Vr) at a reverse current of 10 µA was found to be 20 V or higher. Thus, an elevation of the forward voltage (Vf) by heat during bonding was not found.

The light emitted through the sapphire substrate 101 to the outside had a wavelength of 455 nm. The output of the emitted light, as determined through a typical integrating sphere, was 10 mW. Such characteristics were attained with uniformity from LED to LED among about 10,000 LEDs (products with defective appearance were not included as such had been rejected in advance) produced from a wafer (diameter: 5.1 cm (2 inches)).

Example 2

A stacked structure formed in this Example was as follows:
In FIG. 2, the stacked structure 11 included a substrate 101 formed of sapphire having a c-plane ((0001) crystal plane). On the substrate, via an AlN buffer layer (not illustrated), the following layers were sequentially formed: an undoped GaN layer (thickness: 8 µm) 102; a Ge-doped n-type GaN layer (thickness: 2 µm, carrier concentration: $7 \times 10^{18}$ cm$^{-3}$) 103; an Si-doped n-type $In_{0.01}Ga_{0.99}N$ cladding layer (thickness: 18 nm, carrier concentration: $1 \times 10^{18}$ cm$^{-3}$) 104; a light-emitting layer 105 of a multiple quantum well structure including Si-doped GaN barrier layers (6 layers, thickness: 14.0 nm, carrier concentration: $1 \times 10^{17}$ cm$^{-3}$) and undoped $In_{0.20}Ga_{0.80}N$ well layers (5 layers, thickness: 2.5 nm); an Mg-doped p-type $Al_{0.07}Ga_{0.93}N$ cladding layer 106 (thickness: 12 nm); and an Mg-doped p-type $Al_{0.02}Ga_{0.98}N$ contact layer 107 (thickness: 175 nm). These layers 102 to 107 of the stacked structure 11 were grown through a conventional reduced-pressure MOCVD means.

The Mg-doped p-type AlGaN contact layer 107 was grown through the same procedure as Example 1 and, after completion of vapor-phase growth of the contact layer 107, the stacked structure 11 was cooled to room temperature through the same procedure as Example 1.

After cooling to room temperature, the stacked structure 11 was removed from the growth reactor furnace, and the magnesium atom concentration and the hydrogen atom concentration of the contact layer 107 were quantitatively determined through conventional SIMS. The Mg atom concentration was found to be $1.5 \times 10^{20}$ cm$^{-3}$, and the concentration was virtually uniform from the top to the bottom in the depth direction. The hydrogen atom concentration was found to be $8 \times 10^{19}$ cm$^{-3}$ and was almost uniformly distributed. The resistivity of the contact layer 107 was estimated to be about 180 Ω·cm through conventional TLM.

The LED 10 was fabricated from the stacked structure 11 having the aforementioned p-type contact layer. The procedure of fabrication and the structure of electrodes were similar to Example 1.

Electric characteristics and emission characteristics of the flip-chip type LEDs were evaluated when a forward current was caused to flow between the negative electrode 108 and the positive electrode 109. The forward voltage (Vf) at a forward current of 20 mA was found to be 3.3 V. The reverse voltage (Vr) at a reverse current of 10 µA was found to be 20

V or higher. Thus, an elevation of the forward voltage (Vf) by heat during bonding was not found.

The light emitted through the sapphire substrate 101 to the outside had a wavelength of 455 nm. The output of the emitted light, as determined through a typical integrating sphere, was 12 mW. Such characteristics were attained with uniformity from LED to LED among about 10,000 LEDs (products with defective appearance were not included as such had been rejected in advance) produced from a wafer (diameter: 5.1 cm (2 inches)).

Comparative Example 1

Figure 5:
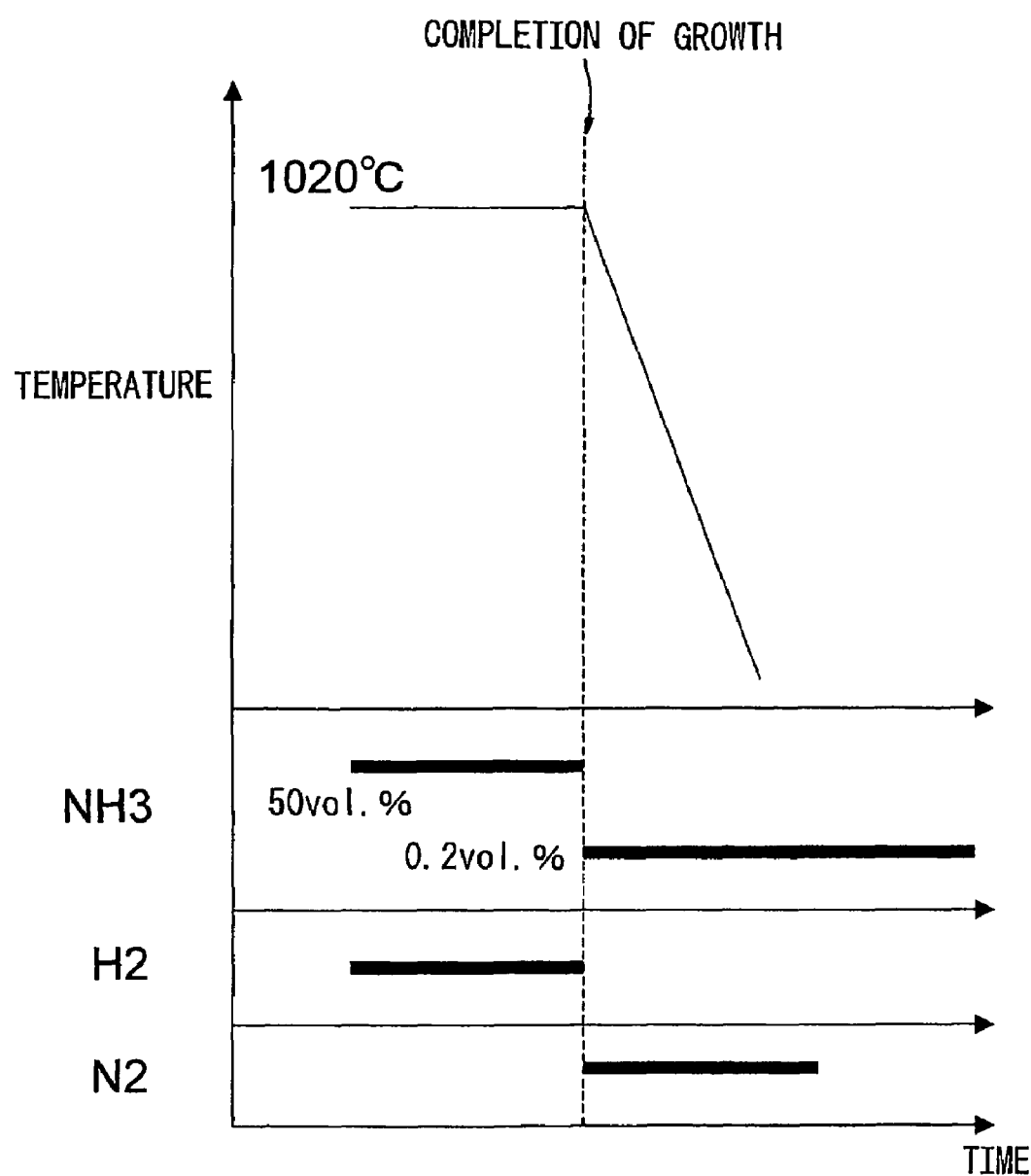
FIG. 5 is a chart schematically showing a temperature lowering profile employed in Comparative Example 1.

The procedure of Example 1 was repeated, except that treatment after completion of the growth of p-type contact layer was performed under different conditions, to thereby form flip-chip type LEDs. In Comparative Example 1, a stacked structure as described in Example 1 was formed under the same conditions and through the same procedure as employed in Example 1. Subsequently, the carrier gas employed during growth was changed from hydrogen to nitrogen, and the flow rate of ammonia was reduced to 0.2%. However, the ammonia continued to flow until temperature was lowered to 350° C. FIG. 5 is a chart schematically showing a temperature lowering profile.

Similar to Example 1, the magnesium atom concentration and the hydrogen atom concentration of the p-type contact layer of the semiconductor sample fabricated in Comparative Example 1 were quantitatively determined through SIMS. The Mg atom concentration was found to be $7 \times 10^{19}$ cm$^{-3}$, which is equivalent to the concentration obtained in Example 1. The hydrogen atom concentration was found to be $7 \times 10^{19}$ cm$^{-3}$. The resistivity of the p-type contact layer was estimated 15,000 Ω·cm through TLM similar to Example 1.

FC-type device chips were fabricated in a manner similar to Example 1, and each chip was placed on a lead frame. Electric characteristics and emission characteristics of the FC-type device chips were evaluated when forward current was caused to flow between the negative electrode 108 and the positive electrode 109. The forward voltage (Vf) at a forward current of 20 mA was found to be 4.0 V, which is higher than that obtained in Example 1. The output of the emitted light was found to be 8 mW.

Comparative Example 2

Figure 6:
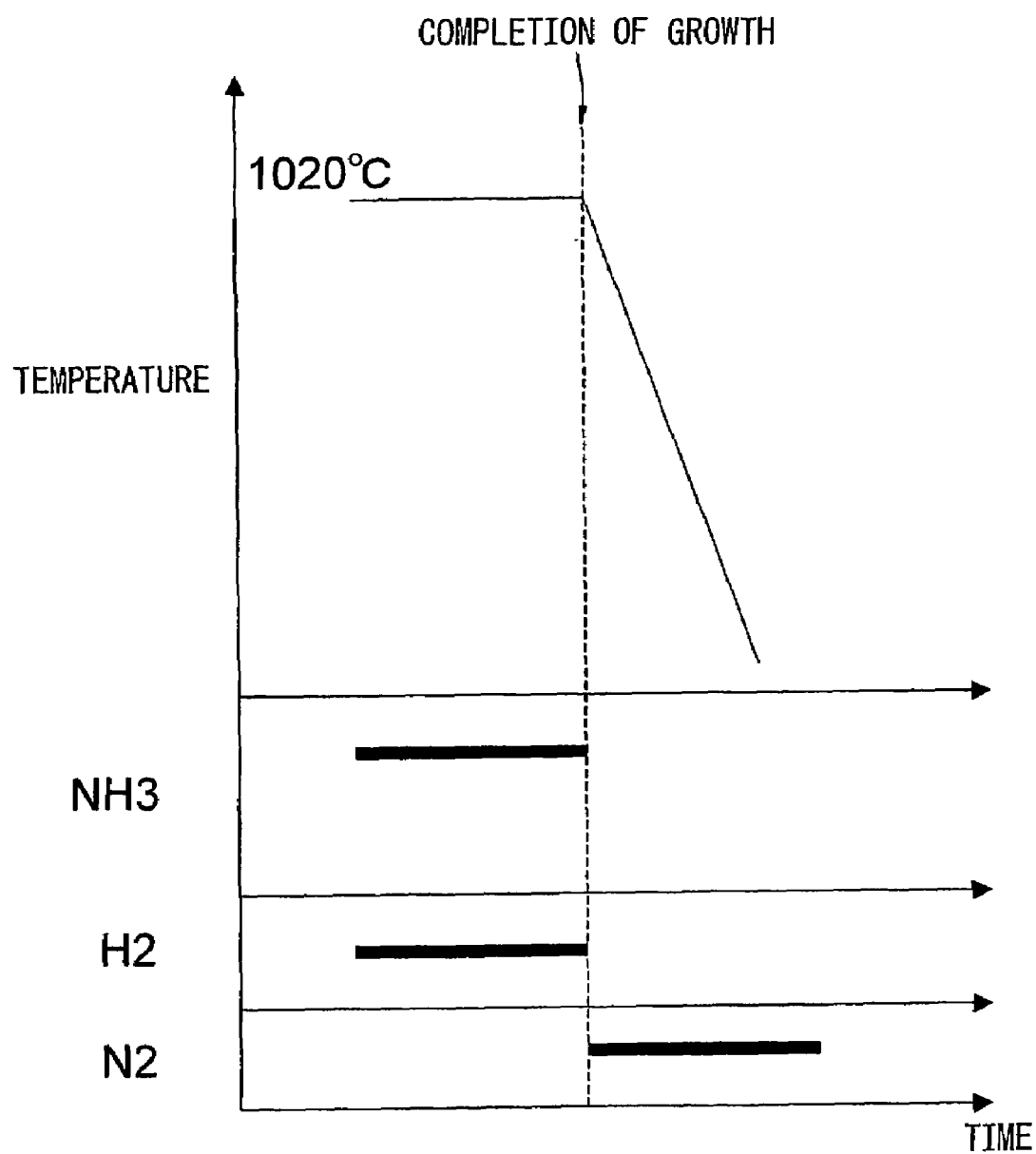
FIG. 6 is a chart schematically showing a temperature lowering profile employed in Comparative Example 2.

The procedure of Example 1 was repeated, except that treatment after completion of the growth of p-type contact layer was performed under different conditions, to thereby form flip-chip type LEDs. In Comparative Example 2, a stacked structure as described in Example 1 was formed under the same conditions and through the same procedure as employed in Example 1. Subsequently, immediately after completion of vapor-phase growth of the p-type contact layer, the carrier gas employed during growth was changed from hydrogen to nitrogen and, at the same time flow of ammonia was stopped. The temperature was lowered to 350° C. under these conditions. FIG. 6 is a chart schematically showing a temperature lowering profile.

Similar to Example 1, the magnesium atom concentration and the hydrogen atom concentration of the p-type contact layer of the semiconductor sample fabricated in Comparative Example 2 were quantitatively determined through SIMS. The Mg atom concentration was found to be $7 \times 10^{19}$ cm$^{-3}$, which is equivalent to the concentration obtained in Example 1. The hydrogen atom concentration was found to be $1 \times 10^{19}$ cm$^{-3}$. The resistivity of the p-type contact layer was estimated 10 Ω·cm through TLM similar to Example 1.

FC-type device chips were fabricated in a manner similar to Example 1, and each chip was placed on a lead frame. Electric characteristics and emission characteristics of the FC-type device chips were evaluated when forward current was caused to flow between the negative electrode 108 and the positive electrode 109. The forward voltage (Vf) at a forward current of 20 mA was found to be 3.0 V, and the output of the emitted light was found to be 10 mW. The reverse voltage (Vr) at a reverse current of 10 µA was found to be 5 V.

Example 3

Figure 7:
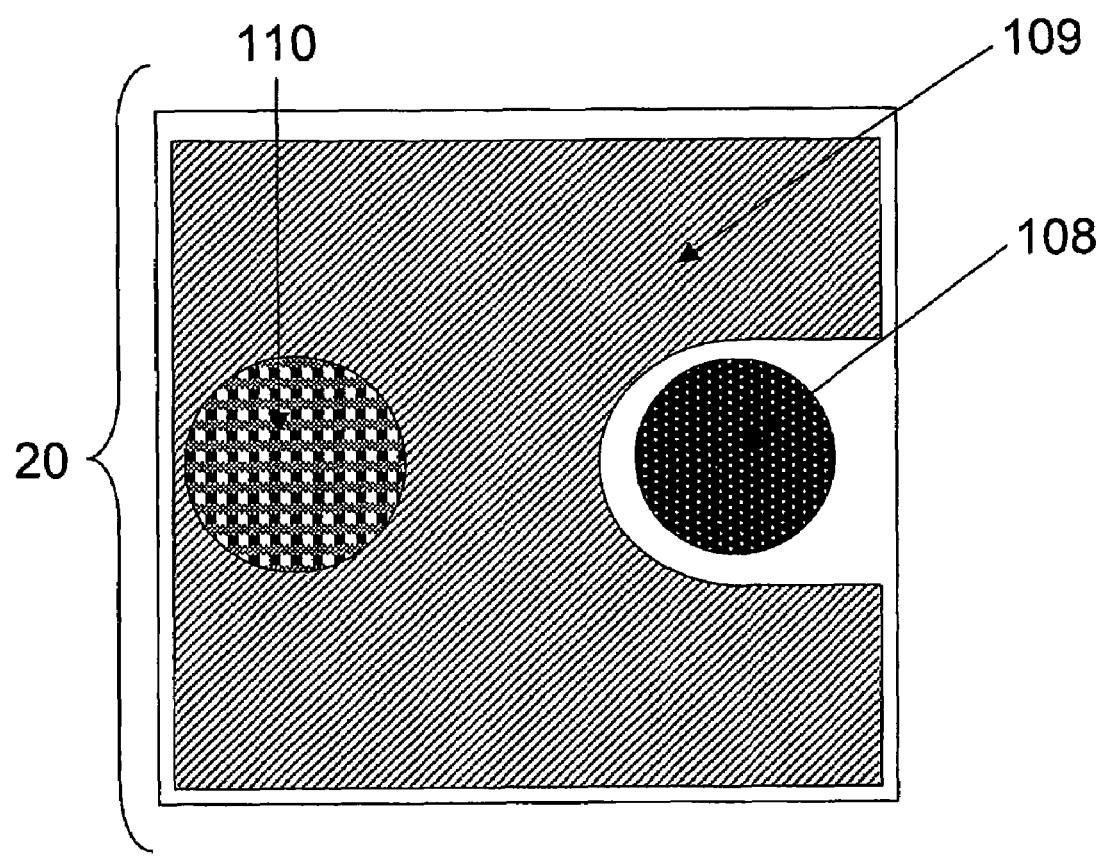
FIG. 7 is a schematic plan view of the LED fabricated in Example 2.

In Example 3, electrodes were provided, in an FU manner, on the same stacked structure 11 as employed in Example 1, to thereby fabricate LEDs. FIG. 7 is a schematic plan view of the electrodes formed in Example 3.

In a manner similar to that of Example 1, a negative electrode 108 as shown in FIG. 7 was formed. On virtually the entire remaining surface of the contact layer 107, a positive electrode 109, which had a multilayer structure of platinum (Pt) film/gold (Au) film and exhibited transparency for extracting light emitted from the light-emitting layer to the outside from the semiconductor layer side, was formed. The Pt film was in contact with the surface of the p-type contact layer 107. On the transparent electrode 109, a bonding pad 110 having an outermost surface of Au was formed. Thereafter, in a manner similar to that of Example 1, the stacked structure was cut into square (350 µm×350 µm) LED 20 pieces.

Electric characteristics and emission characteristics of the LEDs were evaluated when forward current was caused to flow between the negative electrode 108 and the positive electrode 109 of each FU-type chip. The forward voltage (Vf) at a forward current of 20 mA was found to be 3.0 V. The reverse voltage (Vr) at a reverse current of 10 µA was found to be 20 V or higher. The light emitted from the semiconductor layer side to the outside had a wavelength of 455 nm. The output of the emitted light, as determined through a typical integrating sphere, was 6 mW. Such characteristics were attained with uniformity from LED to LED among about 10,000 LEDs (products with defective appearance were not included as such had been rejected in advance) produced from a wafer (diameter: 5.1 cm (2 inches)).

INDUSTRIAL APPLICABILITY

The method of the present invention for producing a p-type Group III nitride semiconductor is capable of producing a light-emitting device exhibiting both high Vr and low operation voltage. Thus, the production method is remarkably useful for producing a p-type Group III nitride semiconductor light-emitting device.

The invention claimed is:

1. A method for producing a Group III nitride semiconductor light-emitting device having an n-type contact layer, a light-emitting layer and a p-type contact layer on a substrate, wherein the method comprises, during lowering temperature after completion of growth of the p-type contact layer composed of AlGaN containing a p-type dopant, immediately after the completion of the growth, starting, at a temperature at which the growth has been completed, supply of a carrier gas composed of an inert gas and reduction of a flow rate of a nitrogen source, wherein the flow rate of the nitrogen source after the reduction is 0.001% to 10% with respect to a flow rate of the total volume of gas; and stopping supply of the nitrogen source at 700° C. to 950° C. in the course of lowering temperature.

2. A production method according to claim 1, wherein the temperature when the growth has been completed is 900° C. or higher.

3. A production method according to claim 1, wherein the nitrogen source is ammonia gas.

4. A production method according to claim 1, wherein a carrier gas employed during growth of the semiconductor contains hydrogen gas.

* * * * *